United States Patent
Horvath

[11] Patent Number: 6,002,569
[45] Date of Patent: Dec. 14, 1999

[54] ELECTROSTATIC DISCHARGE PROTECTION APPARATUS

[75] Inventor: Steven E. Horvath, Roseville, Calif.

[73] Assignee: Hewlett-Packard Company, Palo Alto, Calif.

[21] Appl. No.: 09/106,520

[22] Filed: Jun. 29, 1998

[51] Int. Cl.$^6$ .................................................. H02H 3/00
[52] U.S. Cl. ............................ 361/111; 361/56; 361/118; 361/129
[58] Field of Search ............................... 361/56, 91, 111, 361/113, 118, 119, 127, 129

[56] References Cited

U.S. PATENT DOCUMENTS

| | | | |
|---|---|---|---|
| 3,748,521 | 7/1973 | Wright et al. | 361/91 |
| 4,532,419 | 7/1985 | Takeda | 361/129 |

Primary Examiner—Stephen Jackson

[57] ABSTRACT

Apparatus for protecting at least one internal component of a printed circuit board provided inside a housing from an electrostatic discharge which is generated from outside the housing and enters through an external component to which the at least one internal component is connected, includes a base imbedded between a resist layer and a substrate of the printed circuit board to electrically ground the electrostatic discharge. A node is provided between the external component and the at least one internal component to be protected, for shunting the electrostatic discharge away from the internal component and to the base. Also included is a mask provided in a space between the base and the node for maintaining an electrical disconnection between the base and the node in the absence of the electrical discharge, and for allowing the electrical discharge to be shunted away from the at least one internal component to be protected to ground, via the node and the base, in the presence of the electrical discharge.

12 Claims, 3 Drawing Sheets

ELECTROSTATIC DISCHARGE PROTECTION APPARATUS

The present invention generally relates to apparatus for protecting the internal components of electronic products from electrostatic discharges, and more particularly to improved apparatus for protecting electronic products that are provided on a printed circuit board from electrostatic discharges which originate from outside sources.

It is generally desirable to have some form of electrostatic discharge (ESD) protection for components of electronic products. These components can include switches, buttons, power connectors, I/O connectors, LED's, indicators, network interfaces, the chassis and printed circuit boards (PCB), for example, that are typically electrically connected to components that are internal to the product casing. As such, when the ESD is applied to an external component from, for example, a user touching a switch and discharging an electrostatic potential present on the user, the discharge is likewise applied to the internal components such as a logic device or integrated circuit via the external component. While the external components such as a switch are in general quite robust and are not easily damaged by ESD events, the internal components are susceptible to hard failures from the ESD.

One known solution for protecting sensitive internal components of the electronic products entails adding a discrete device to the circuit connection between the external component that is expected to be hit by ESD and the internal components to which the external component is connected. The discrete device might be a zener diode, a signal diode, a series resistor or a transient suppressor, for example. One disadvantage of employing a discrete protection device is that it must be separated by some minimum distance from the external component. Consequently, the ESD cannot be localized to the external component, which increases the likelihood of the ESD reaching and causing harm to the central part of the internal circuitry. Other disadvantages of separating the protection device from the external component include an electromagnetic field (EMF) being created inside the product, an increase in the probability of a secondary discharge occurring within the product casing, and a build-up of static voltage potential on floating conductors.

Another known solution, especially adapted for protecting integrated circuits, involves adding ESD protection within the internal component, e.g., special shunting devices such as a spark gap built into the substrate of the integrated circuits. However, this method is not satisfactorily effective in most cases.

Yet another known approach involves employing a spark gap on a printed circuit board (PCB). This approach entails placing a piece of electrically grounded metal on the PCB very close to a node on the circuitry to be protected, for the purpose of creating an air gap. When the ESD exceeds a predetermined breakdown voltage, the ESD energy conducts through the gap to ground, thereby protecting the circuitry connected to the node. This approach has been generally unsuccessful and is rarely used in production because of shortcomings related to manufacturability and performance.

One problem with the spark gap approach is that the protected circuitry connected to the node becomes shorted as a result of solder bridging across the spark gap during a wave solder production process, particularly if the spark gap is placed on the circuit side of the PCB. This is because the distance between the grounded metal piece and the node is usually very small, e.g., approximately 0.01 to 0.04 inches. Widening the spark gap to prevent the solder from bridging the gap only increases the breakdown potential of the spark gap, which reduces the effectiveness of the gap. Spark gaps placed on the component side of the PCB are difficult to place near the external component, which also reduces the effectiveness of the gap. Component side gaps also cause significantly more electromagnetic interference with other internal components on the PCB.

Accordingly, it is the primary object of the present invention to provide an improved ESD protection device that has a spark gap which is sufficiently small to effectively shunt the ESD to ground.

Another object of the present invention is to provide such a device which prevents solder from shorting the spark gap.

Yet another object of the present invention is to provide an improved ESD protection device which can be located proximate to the external device through which the ESD is applied to the internal components.

A related object of the present invention is to provide such a device that localizes the ESD to the external device and prevents the ESD from reaching the central part of the internal components.

Another related object of the present invention to provide an improved ESD protection device which significantly reduces electromagnetic interference with the internal components in the electronic product.

It is another object of the present invention to provide an improved ESD protection device which offers better protection for integrated circuit components.

These and other objects will become apparent upon reading the following detailed description of the present invention, while referring to the attached drawings, in which.

DETAILED DESCRIPTION

Figure 1:
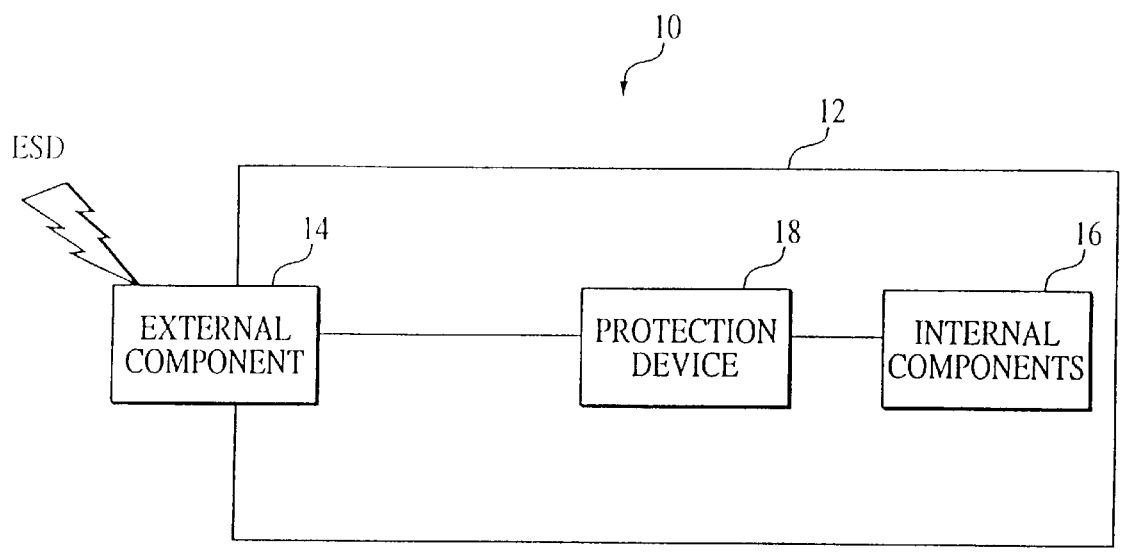
FIG. 1 is a block diagram showing the location of the apparatus embodying the present invention relative to an external device and the internal components of an electronic product to be protected from an electrostatic discharge.

The present invention is directed to an apparatus for protecting internal components on a printed circuit board (PCB) located inside an electronic product from an electrostatic discharge (ESD) which is generated from outside the electronic product. The ESD is applied to the internal components on the PCB through an external component of the product which is connected to the PCB and is also accessible from the outside of the product, such as a switch, thereby causing damages to the internal components. In the present invention, a "spark gap" is created on the PCB between the internal component to be protected and ground so that any potential that exceeds the breakdown voltage will cause the material or air in the spark gap to ionize and conduct the ESD energy to ground. By shunting the ESD current to ground, the potentially harmful impact to the internal components is minimized.

One important aspect of the present invention is that a nonconductive mask is provided in the spark gap, so that the distance of the gap can be minimized and yet prevent solder from bridging this gap during the manufacture of the PCB. The mask is formed from the same standard solder resist layer which is used throughout the conventional PCB, and therefore, is cost effective to manufacture. Another important advantage of the present invention is that the spark gap can be located very close to the external component, which avoids the above-mentioned problems associated with the conventional discrete protection devices, which must be separated by some minimum spacing from the external devices.

Broadly stated, the ESD protection apparatus of the present invention includes a base imbedded between the resist layer and the substrate of a printed circuit board to electrically ground the electrostatic discharge. A node is provided between an external component and at least one internal component to be protected, for shunting the electrostatic discharge away from the internal component and to the base. A mask is also provided in a space between the base and the node for maintaining an electrical disconnection between the base and the node in the absence of the electrical discharge, and for allowing the electrical discharge to be shunted away from the internal component to be protected to ground, via the node and the base in the presence of the electrical discharge.

The method for implementing the present invention includes imbedding a base between the resist layer and the substrate of a printed circuit board and electrically connecting the base to ground. A node is also imbedded between the resist layer and the substrate at a point between the external component and at least one internal component to be protected, so that the electrostatic discharge is shunted away from the internal component and to the base. Further, a first opening is created in the resist layer to partially expose the base means, and a second opening is created on the resist layer to expose the node. The second opening is created so that a portion of the resist layer between the first opening and the second opening is left to act as a mask. The mask maintains an electrical disconnection between the base and the node in the absence of the electrical discharge, and allows the electrical discharge to be shunted away from the internal component to be protected and to ground, via the node and the base, in the presence of the electrical discharge.

Turning now to the drawings, and particularly FIG. 1, an electronic product is generally indicated at 10, and includes a product case or chassis 12, an external component 14, internal components 16 and an ESD protection device 18 connected between the external component and the internal components. The external component 14 is accessible from the outside of the electronic product 10. As a result, an ESD generated outside the product case 12 and applied to the external component 14 would reach and cause damage to the internal components 16, if the protection device 18 is not provided. The external device 14 is commonly found in most electronic products 10 and may be devices such as on/off switches, power connectors, I/O connectors, LED's, status indicators, etc. The internal components 16, such as integrated circuits, are typically provided on printed circuit boards (PCB).

Figure 2:
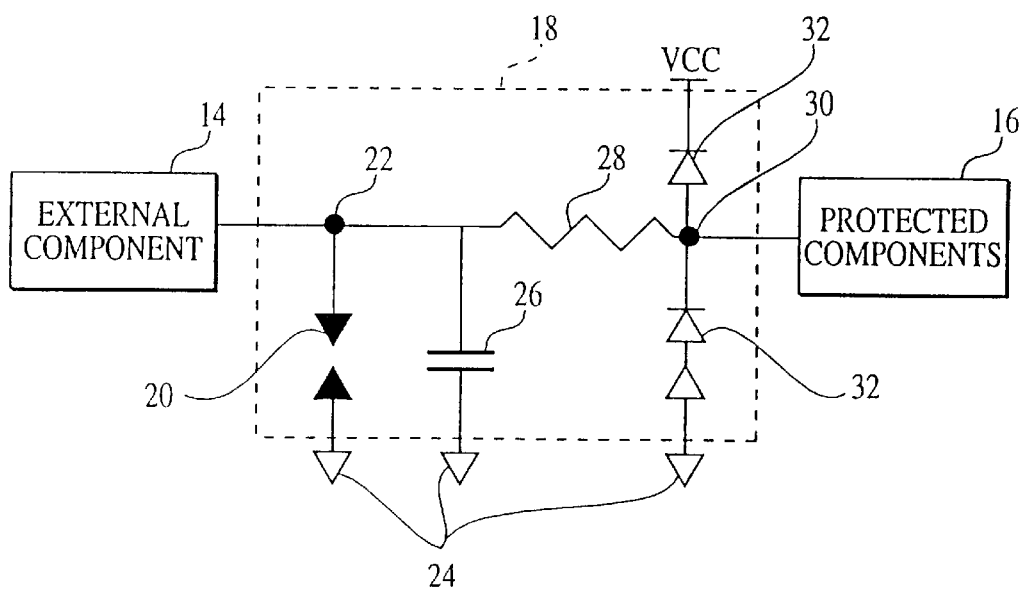
FIG. 2 is an electrical schematic diagram of the apparatus embodying the present invention.

Referring to FIG. 2, the ESD protection device 18 includes a spark gap 20 having one end connected a node 22 and the other end to ground 24. A shunt capacitor 26 is also connected to the node 22 and to ground 24 in parallel with the spark gap 20 to "absorb" some of the ESD, thus limiting the total voltage potential on the node 22. Additionally, a resistor 28 is connected in series between the node 22 and the protected components 16 at a node 30. The resistor 28 reduces the high frequency component of the ESD that reaches the protected internal components 16, and also forces the ESD to arc at the spark gap 20. Preferably, the value of the resistor 28 should be approximately 100 ohms or greater.

The ESD protection device 18 further includes a pair of high speed signal latching diodes 32, one of which is connected between the power source (VCC) and the node 30. The other diode 32 is connected between the node 30 and ground 24. The diodes 32 clamp the potential to either ground 24 or VCC when a sufficiently large ESD is induced on the node 30, and are reverse-biased during normal operation. While one end of each of the diodes 32 are preferably connected to node 30, as shown in FIG. 2, they can also be connected to the node 22.

The capacitor 26, the resistor 28 and the latching diodes 32, as shown in FIG. 2, are included in the preferred embodiment of the ESD protection device 18. It is important to note, however, that the spark gap 20 is the key feature of the present invention, and that the ESD protection device 18 may comprise of the spark gap 20, without the other features of the protection device shown in FIG. 2, particularly if it important to reduce manufacturing costs.

Figure 3:
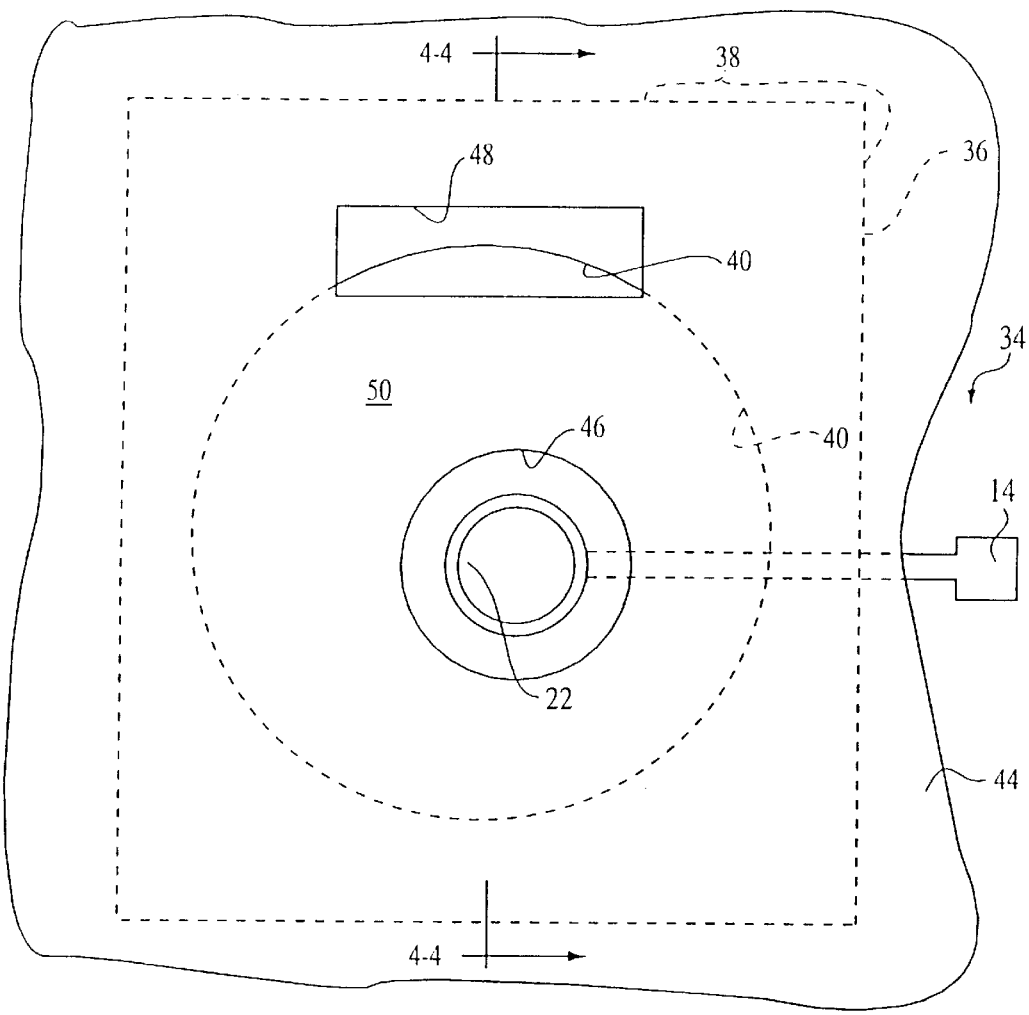
FIG. 3 is a top view of a spark gap of the apparatus embodying the present invention.
Figure 4:
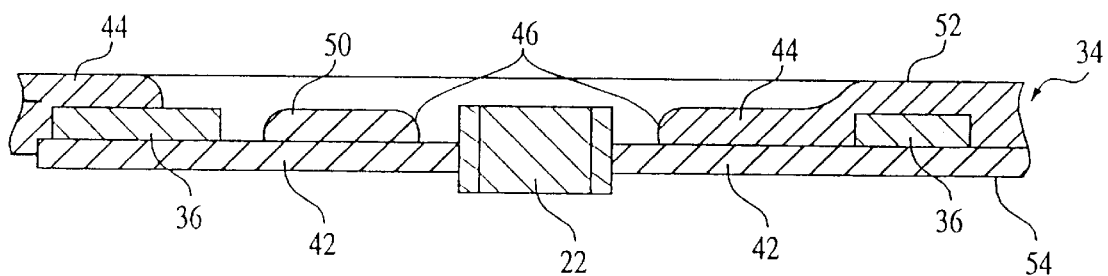
FIG. 4 is a sectional view of the spark gap of FIG. 3 and is taken generally along line 4—4.

In this regard, the spark gap 20, as shown in FIGS. 3 and 4, is implemented directly on the printed circuit board (PCB) 34, and includes a copper base 36 having a generally rectangular outer perimeter 38 and a circular opening 40. The base 36 is connected to ground 24 (connection not shown), and is imbedded between the substrate 42 of the PCB 34 and a layer of solder resist 44, which generally overlaps the entire substrate and has a preferred thickness of approximately 0.01 inch (best shown in FIG. 4). The opening 40 of the base 36 is generally concentric about the node 22, which is connected between the external component 14 and the internal components 16 to be protected (best shown in FIG. 2). The node 22 is located within a generally circular opening 46 in the solder resist layer 44 so that the node is exposed.

It should be noted that while the base 36 is described above as being made of copper and having a square outer perimeter 38 and a circular opening 40, the base may be of any conductive material and have the opening 40 and the outer perimeter 38 in various other shapes. The opening 46 in the solder resist layer 44 may also have a shape different than circular.

In accordance with an important aspect of the present invention, a thin sliver or opening 48 is formed in the area on the solder resist layer 44 such that the sliver partially exposes the base opening 40. The sliver 48 generally has a rectangular shape, although other shapes are contemplated. The width is preferably about 0.010 inch and the preferred length may be anywhere from about 0.100 inch to 1.0 inch. The area of the solder resist layer 44 between the opening 46 for the node 22 (the node side of the spark gap 20) and the sliver 48 (the ground side of the spark gap 20) constitutes a mask 50. The mask 50 prevents the node 22 and the base 36 from being bridged by solder during the manufacturing process of the PCB 34, and yet allows the ESD to be shunted away from the node 22 to ground 24.

To improve the effectiveness of the protection device 18, the spark gap 20 is preferably implemented on the circuit side 52 of the PCB 34, as opposed to the component side 54, and the rest of the components of the preferred ESD protection device 18 (best shown in FIG. 2), i.e., the capacitor 26, the resistor 28 and the latching diodes 30, which are known to be sensitive to the ESD, are provided on the component side 54 of the PCB. Also, the spark gap 20 is preferably provided on the circuit side 52 of the PCB 34 directly beneath the external component 14 on the component side 54 (best seen in FIG. 5), if possible, or at least as close to the external component as allowed by the configuration of the PCB (best seen in FIG. 3). In this manner, the spark gap 20 eliminates or reduces the problems described above associated with having to place a protection device some distance away from the external components, as in conventional methods using discrete protection devices.

Figure 5:
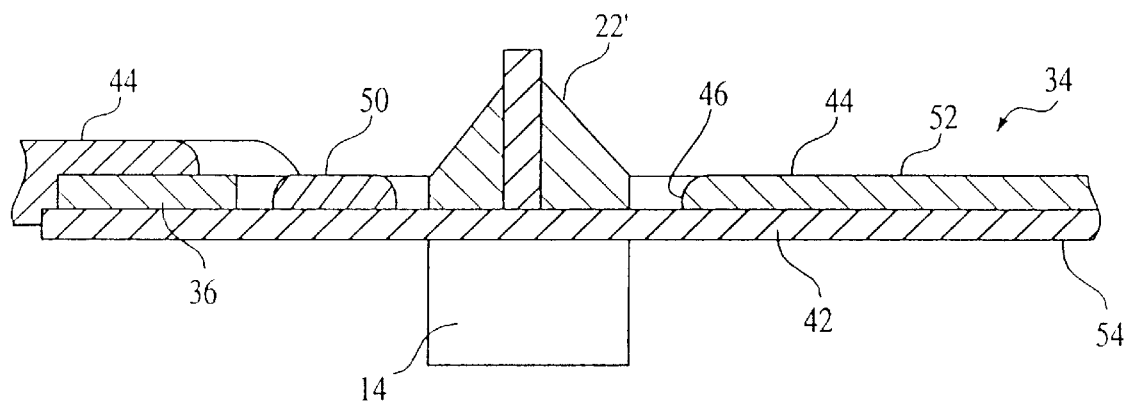
FIG. 5 is a sectional view of an alternate embodiment of the spark gap of FIG. 4; and, FIG. 6 is a sectional view of another alternate embodiment of the spark gap of FIG. 4.
Figure 6:
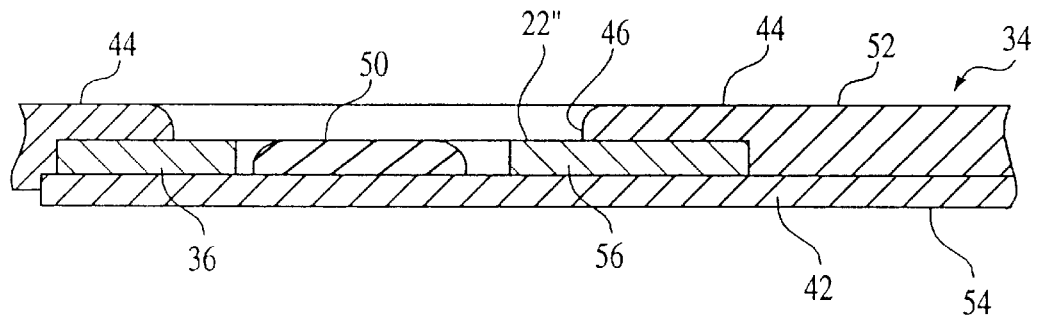

In FIGS. 3 and 4, the protected node 22 is shown to be a "via," which allow the components on one side of the PCB 34 to be connected to the circuits on the opposite side of the PCB. It should be understood, however, that the node 22 can be any number of conductive features on the PCB 34. For example, the node 22 can be a lead of a through-hole component 22' such as a switch or a connector, which has a lead that projects through the PCB 34, as shown in FIG. 5 (the reference numbers that are the same as those of FIG. 4 denote the same features). The node 22 can also be a circuit board trace 56 with a portion 22" thereof exposed in the resist layer opening 46, as shown in FIG. 6, and another portion connected to the external component 14 (connection not shown).

From the foregoing detailed description, it should be understood that a ESD protection device for shunting electrostatic discharge produced outside an electronic product away from sensitive internal components of the electronic product has been shown which has many advantages and desirable attributes. Of particular advantage is the mask provided in the spark gap to allow the gap between the node and the base to be small as necessary and yet prevent the solder from bridging the gap. Another advantage is that the present protection device can be implemented very close to the external component that is expected to be hit by ESD so that the effect of ESD charge is minimized in the internal components of the product. Further, the present invention is significantly more effective in protecting integrated circuits than the conventional protection features which are internal to the integrated circuits.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the following claims.

What is claimed is:

1. Apparatus for protecting at least one internal component of a printed circuit board provided inside a housing from an electrostatic discharge which is generated from outside the housing and enters through an external component to which the at least one internal component is connected, said apparatus comprising:

base means imbedded between a resist layer and a substrate of the printed circuit board for electrically grounding the electrostatic discharge;

node means electrically connected between the external component and the at least one internal component to be protected, for shunting the electrostatic discharge away from the internal component to said base means;

mask means provided in an open gap between said base means and said node means for maintaining an electrical disconnection between said base means and said node means in the absence of the electrical discharge, and for allowing the electrical discharge to be shunted away from the at least one internal component to be protected to ground, via said node means and said base means, in the presence of the electrical discharge.

2. The apparatus as defined in claim 1 wherein said base means is a sheet of copper connected to ground.

3. The apparatus as defined in claim 1 wherein said node is a via.

4. The apparatus as defined in claim 1 wherein said node is a through-hole component.

5. The apparatus as defined in claim 1 further including a resistor connected in series between the external component and the internal component to be protected.

6. The apparatus as defined in claim 1 further including a capacitor connected said ground and between the external component and the internal component to be protected.

7. The apparatus as defined in claim 1 further including a first latching diode connected between a power supply and between the external component and the internal component to be protected, and a second latching diode connected between said ground and between the external component and the internal component.

8. The apparatus as defined in claim 1 wherein said base means, node means and said mask are located on a circuit side of the printed circuit board.

9. The apparatus as defined in claim 1 wherein said base means, node means and said mask are positioned substantially proximate the external component.

10. The apparatus as defined in claim 1 further including a first opening on said resist layer for partially exposing said base means imbedded between said substrate and said resist layer, and a second opening on said resist layer for exposing said node means, and wherein said mask means is a portion of said resist layer formed between said first opening and said second opening.

11. The apparatus as defined in claim 10 wherein said node is a board trace having a segment in said second opening.

12. A method for protecting at least one internal component of a printed circuit board provided inside a housing from an electrostatic discharge which is generated from outside the housing and enters through an external component to which the at least one internal component is connected, said method comprising the steps of:

imbedding a base between a resist layer and a substrate of the printed circuit board and electrically connecting the base to ground;

imbedding a node between said resist layer and said substrate at a point between the external component and the at least one internal component to be protected, so that the electrostatic discharge is shunted away from the internal component and to said base;

creating a first opening in said resist layer to partially expose said base means;

creating a second opening on said resist layer to expose said node means; and leaving a portion of said resist layer between said first opening and said second opening to act as a mask, so that said mask maintains an electrical disconnection between said base and said node in the absence of the electrical discharge, and allows the electrical discharge to be shunted away from the at least one internal component to be protected to ground, via said node and said base, in the presence of the electrical discharge.

* * * * *